(12) United States Patent
Ham

(10) Patent No.: US 7,370,789 B2
(45) Date of Patent: May 13, 2008

(54) VARIABLE FIELD-OF-VIEW GRADIENT COIL SYSTEM FOR MAGNETIC RESONANCE IMAGING

(75) Inventor: Cornelis Leonardus Gerardus Ham, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 88 days.

(21) Appl. No.: 10/595,579

(22) PCT Filed: Oct. 18, 2004

(86) PCT No.: PCT/IB2004/052121

§ 371 (c)(1),
(2), (4) Date: Apr. 28, 2006

(87) PCT Pub. No.: WO2005/043185

PCT Pub. Date: May 12, 2005

(65) Prior Publication Data

US 2007/0063705 A1 Mar. 22, 2007

(30) Foreign Application Priority Data

Oct. 29, 2003 (EP) .................................. 03103998

(51) Int. Cl.
*G01V 3/00* (2006.01)
(52) U.S. Cl. ...................... 234/318; 324/307
(58) Field of Classification Search ......... 324/318–322
See application file for complete search history.

(56) References Cited

U.S. PATENT DOCUMENTS

| 4,509,030 A | * | 4/1985 | Vermilyea .................... 335/216 |
| 5,406,204 A | | 4/1995 | Morich et al. |
| 5,655,533 A | * | 8/1997 | Petropoulos et al. ....... 600/422 |
| 5,736,858 A | | 4/1998 | Katznelson et al. |
| 6,011,394 A | * | 1/2000 | Petropoulos et al. ....... 324/318 |

(Continued)

FOREIGN PATENT DOCUMENTS

GB 2 364 784 A 2/2002

OTHER PUBLICATIONS

Kimmlingen, R., et al.; Gradient System Providing Continuously Variable Field Characteristics; 2002; Magnetic Resonance in Medicine; 47:800-808.

*Primary Examiner*—Brij Shrivastav
*Assistant Examiner*—Tiffany A. Fetzner

(57) ABSTRACT

The present invention relates to a gradient coil system for magnetic resonance imaging (MRI) systems and to a magnetic resonance imaging (MRI) system comprising such a gradient coil system. Magnetic resonance imaging systems comprise at least a main magnet system, a gradient coil system, a RF system and a signal processing system. The gradient coil system according to the present invention comprises at least two X primary coil-like elements ($X1_{pc}$, $X2_{PC}$), at least two Y primary coil-like elements ($Y1_{pc}$, $Y2_{pc}$) and one Z primary coil-like element ($Z_{PC}$) providing a modular gradient coil system, wherein the at least two X primary coil-like elements ($X1_{PC}$, $X2_{PC}$) have mutually different linearity volumes by themselves or in combination with each other, the at least two Y primary coil-like elements ($Y1_{PC}$, $Y2_{PC}$) have mutually different linearity volumes by themselves or in combination with each other, and the one Z primary coil-like element ($Z_{PC}$) is placed between the X primary coil-like elements ($X1_{PC}$, $X2_{PC}$) and the Y primary coil-like elements ($Y1_{PC}$, $Y2_{PC}$).

19 Claims, 3 Drawing Sheets

U.S. PATENT DOCUMENTS

| | | |
|---|---|---|
| 6,078,177 A | 6/2000 | Petropoulos et al. |
| 6,311,389 B1 | 11/2001 | Uosaki et al. |
| 6,441,614 B1 * | 8/2002 | Edelstein et al. ............ 324/318 |
| 6,479,999 B1 | 11/2002 | DeMeester et al. |
| 6,538,443 B2 * | 3/2003 | Morich et al. .............. 324/318 |
| 6,552,545 B2 * | 4/2003 | Kaindl et al. ............... 324/318 |
| 6,642,717 B2 * | 11/2003 | Dietz et al. ................. 324/318 |
| 6,741,152 B1 * | 5/2004 | Arz et al. .................... 335/300 |
| 6,788,057 B1 * | 9/2004 | Petropoulos et al. ....... 324/318 |
| 6,933,722 B2 * | 8/2005 | Tsuda et al. ................. 324/318 |
| 7,015,692 B2 * | 3/2006 | Clarke et al. ................ 324/300 |
| 2002/0008516 A1 * | 1/2002 | Dietz et al. .................. 324/318 |
| 2002/0175684 A1 | 11/2002 | Schaaf |
| 2004/0189298 A1 * | 9/2004 | Vavrek et al. ............... 324/309 |
| 2005/0030028 A1 * | 2/2005 | Clarke et al. ................ 324/318 |
| 2005/0035764 A1 * | 2/2005 | Mantone et al. ............. 324/318 |
| 2005/0146330 A1 * | 7/2005 | Teklemariam et al. ....... 324/318 |
| 2005/0179512 A1 * | 8/2005 | Weyers et al. ............... 335/300 |
| 2006/0262826 A1 * | 11/2006 | Dietz et al. .................... 372/96 |
| 2007/0063705 A1 * | 3/2007 | Ham .......................... 324/318 |

* cited by examiner

VARIABLE FIELD-OF-VIEW GRADIENT COIL SYSTEM FOR MAGNETIC RESONANCE IMAGING

The present invention is related to a gradient coil system for magnetic resonance imaging (MRI) systems. The invention further relates to a magnetic resonance imaging (MRI) system comprising such a gradient coil system.

The basic components of a magnetic resonance imaging (MRI) system are the main magnet system, the gradient coil system, the RF system and the signal processing system. The main magnet system comprises a bore hole enabling the entry of an object to be analyzed by the MRI system and generates a strong uniform static field for polarization of nuclear spins in the object to be analyzed. The gradient coil system is designed to produce time-varying magnetic fields of controlled spatial non-uniformity. The gradient coil system is a crucial part of the MRI system because gradient fields are essential for signal localization. The RF system mainly consists of a transmitter coil and a receiver coil, the transmitter coil being capable of generating a rotating magnetic field for excitation of a spin system, and the receiver coil converting a precessing magnetization into electrical signals. The signal processing system generates images on the basis of the electrical signals.

According to the prior art, the gradient coil system normally comprises three orthogonal primary coil-like elements, namely a so-termed X primary coil, Y primary coil and Z primary coil. The X, Y and Z nomenclature refers to the imaginary orthogonal axes used in describing MRI systems, wherein the Z axis is an axis co-axial with the axis of the bore hole of the main magnet system, the X axis is the vertical axis extending from the center of the magnetic field, and the Y axis is the corresponding horizontal axis orthogonal to the Z axis and the X axis. In addition to the three primary coil-like elements, a gradient coil system according to the prior art may also comprise three orthogonal shield coil-like elements, namely a so-called X shield coil, Y shield coil and Z shield coil.

From the prior art multimode gradient coil systems are known, wherein such a multimode gradient coil system according to the prior art comprises two X primary coil-like elements, two Y primary coil-like elements and two Z primary coil-like elements. The system may also comprise two X shield coil-like elements, two Y shield coil-like elements and two Z shield coil-like elements A multimode gradient coil system is sometimes also called modular gradient coil system or twin-coil system.

The prior art document U.S. Pat. No. 5,736,858 discloses a modular gradient coil system for a MRI system. However, it should be noted that the X, Y and Z nomenclature used in U.S. Pat. No. 5,736,858 is slightly different. According to U.S. Pat. No. 5,736,858 the Z axis is the axis co-axial with the axis of the bore hole of the main magnet system; the Y axis is the vertical axis extending from the center of the magnetic field; the X axis is the corresponding horizontal axis orthogonal to the Z axis and the Y axis. However, in both nomenclatures the Z axis is the axis co-axial with the axis of the bore hole of the main magnet system.

It should be noted that the terms "coil" and "coil-like element" used within this patent application should cover all types of coils, including coils having shapes as disclosed in U.S. Pat. No. 6,078,177. U.S. Pat. No. 6,078,177 discloses a "3D-type" of coil, wherein primary and shield coils are connected with a set of conductors on a conical shape between an inner surface and an outer surface of the gradient coil system, which conical shape could also be a flange. So, within the present invention a "coil" or a "coil-like element" can be either of conventional design or such a "3D-type".

The present invention is related to a modular gradient coil system of such a MRI system.

The present invention provides a gradient coil system for magnetic resonance imaging systems, comprising at least two X primary coil-like elements, at least two Y primary coil-like elements and one Z primary coil-like element providing a modular gradient coil system, wherein the at least two X primary coil-like elements have mutually different linearity volumes by themselves or in combination with each other, the at least two Y primary coil-like elements have mutually different linearity volumes by themselves or in combination with each other, and the one Z primary coil-like element is placed between the X primary coil-like elements and the Y primary coil-like elements.

In accordance with a preferred embodiment of the invention the gradient coil system comprises in addition at least two X shield coil-like elements, at least two Y shield coil-like elements and one Z shield coil-like element, wherein the one Z shield coil-like element is placed between the X shield coil-like elements and the Y shield coil-like elements.

In accordance with a further improved, preferred embodiment of the invention the Z coil-like elements are made from hollow conductors, the Z coil-like elements being directly cooled by a cooling fluid, e.g. water, flowing through said respective hollow conductors.

Furthermore, according to the present invention, the modular gradient coil system comprises two X primary coil-like elements, two Y primary coil-like elements and one Z primary coil-like element providing an inner coil arrangement, as well as two X shield coil-like elements, two Y shield coil-like elements and one Z shield coil-like element providing an outer coil arrangement, a layer comprising epoxy with filler material and/or a GRP tube layer being positioned between the inner coil arrangement and the outer coil arrangement.

In addition, the present invention provides a magnetic resonance imaging system comprising such a gradient coil system.

Embodiments of a gradient coil system and a magnetic resonance imaging system in accordance with the invention will be described in the following with reference to the Figures, in which.

Figure 1:
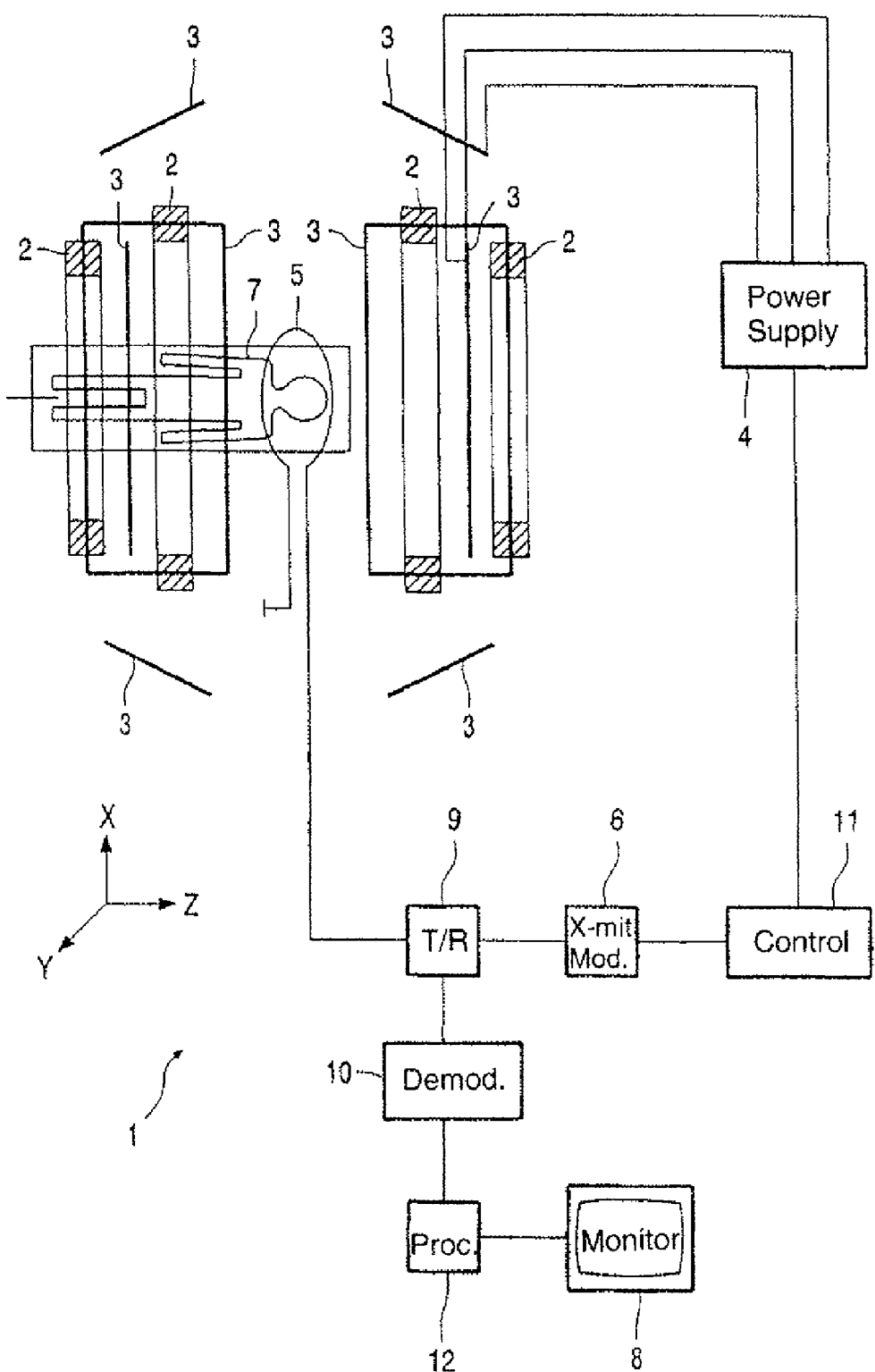
FIG. 1 shows a MRI system according to the prior art.

FIG. 1 shows a magnetic resonance imaging (MRI) system 1 known from the prior art which includes a main magnet system 2 for generating a steady magnetic field, and also several gradient coils providing a gradient coil system 3 for generating additional magnetic fields having a gradient in the X, Y, Z directions. The Z direction of the coordinate system shown corresponds to the direction of the steady magnetic field in the main magnet system 2 by convention. The Z axis is an axis co-axial with the axis of a bore hole of the main magnet system 2, the X axis is the vertical axis extending from the center of the magnetic field, and the Y axis is the corresponding horizontal axis orthogonal to the Z axis and the X axis.

The gradient coils of the gradient coil system 3 are fed by a power supply unit 4. An RF transmitter coil 5 serves to generate RF magnetic fields and is connected to an RF transmitter and modulator 6.

A receiver coil is used to receive the magnetic resonance signal generated by the RF field in the object 7 to be examined, for example a human or animal body. This coil may be the same coil as the RF transmitter coil 5. Furthermore, the main magnet system 2 encloses an examination space which is large enough to accommodate a part of the body 7 to be examined. The RF coil 5 is arranged around or on the part of the body 7 to be examined in this examination space. The RF transmitter coil 5 is connected to a signal amplifier and demodulation unit 10 via a transmission/reception circuit 9.

The control unit 11 controls the RF transmitter and modulator 6 and the power supply unit 4 so as to generate special pulse sequences which contain RF pulses and gradients. The phase and amplitude obtained from the demodulation unit 10 are applied to a processing unit 12. The processing unit 12 processes the presented signal values so as to form an image by transformation. This image can be visualized, for example by means of a monitor 8.

According to the present invention, the magnetic resonance imaging (MRI) system 1 comprises an improved gradient coil system which will be described below in greater detail. The present invention provides a new gradient coil system for magnetic resonance imaging systems.

Figure 2:
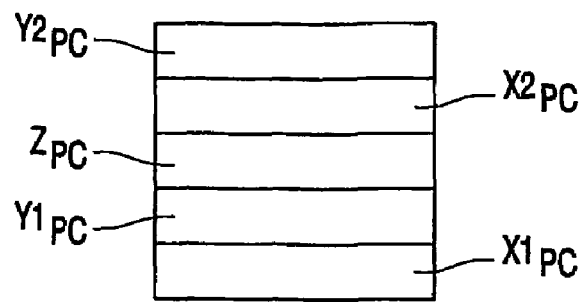
FIG. 2 shows a cross-sectional view through a detail of a gradient coil system according to a first embodiment of the present invention.

FIG. 2 shows a detail of a gradient coil system 13 according to a first embodiment of the present invention, illustrating schematically the radial build-up structure. The gradient coil system 13 according to FIG. 2 comprises two X primary coils, two Y primary coils and one Z primary coil. The two X primary coils have mutually different linearity volumes by themselves, i.e. a first non-linear X primary coil $X1_{PC}$ has a smaller linearity volume than a second linear X primary coil $X2_{PC}$. The two Y primary coils also have mutually different linearity volumes, i.e. a first non-linear Y primary coil $Y1_{PC}$ has a smaller linearity volume than a second linear Y primary coil $Y2_{PC}$.

It should be noted that according to the present invention the two X (and two Y) primary coils can also have mutually different linearity volumes in combination with each other, meaning that the first X primary coil $X1_{PC}$ has an intermediate linearity volume, while the second X primary coil $X2_{PC}$ is designed as a correction coil, which, in combination with the first X primary coil $X1_{PC}$ results in a smaller or larger linearity volume, depending on the polarity of the current in the correction coil. Such a second X primary coil $X2_{PC}$ designed as a correction coil can be driven with a separate amplifier (not shown) or connected in series with the first X primary coil $X1_{PC}$ by a switch (not shown). Such a switch can also connect the correction coil in reverse polarity.

The one Z primary coil $Z_{PC}$ is positioned or placed or sandwiched between the X primary coils and the Y primary coils.

The present invention provides a modular gradient coil system with two X primary coils and two Y primary coils, but with only one Z primary coil. The present invention has found that only one Z primary coil is sufficient to provide an effective modular gradient coil system 13. The Z primary coil is more efficient than the X and Y primary coils and has a higher PNS (peripheral nerve stimulation) threshold. There is therefore no need for a twin Z primary coil.

According to the embodiment shown in FIG. 2, the one Z primary coil $Z_{PC}$ is placed between the two X primary coils and the two Y primary coils in such a way that on the first side of the Z primary coil $Z_{PC}$ there is positioned the first non-linear X primary coil $X1_{PC}$ and the first non-linear Y primary coil $Y1_{PC}$. On this first side of the one Z primary coil $Z_{PC}$ the non-linear Y primary coil $Y1_{PC}$ is positioned between the Z primary coil $Z_{PC}$ and the non-linear X primary coil $X1_{PC}$. On the adjacent second side of the Z primary coil $Z_{PC}$ there is arranged the second linear X primary coil $X2_{PC}$ and the second linear Y primary coil $Y2_{PC}$. On this second side of the Z primary coil $Z_{PC}$ the linear X primary coil $X2_{PC}$ is positioned between said Z primary coil $Z_{PC}$ and the linear Y primary coil $Y2_{PC}$. The one Z primary coil is positioned or sandwiched between the two X primary coils and the two Y primary coils. The non-linear X primary coil $X1_{PC}$ is located at the innermost radial position. It should be noted that the radial order of the two X and two Y primary coils can be different from the embodiment shown in FIG. 2. For example, the non-linear Y primary coil $Y1_{PC}$ could be located at the innermost radial position.

In the case that one of the two X (and one of the two Y) primary coils is designed as a correction coil, it is preferred to locate the correction coil at the larger radius of the coil arrangement.

The five primary coils of the arrangement according to FIG. 2 are glued together. Between each pair of two adjacent primary coils an electrical insulation layer is provided. This means that between the first non-linear X primary coil $X1_{PC}$ and the first non-linear Y primary coil $Y1_{PC}$ there is positioned a first electrical insulation layer. Furthermore, an electrical insulation layer is positioned between the first non-linear Y primary coil $Y1_{PC}$ and the one Z primary coil $Z_{PC}$, between the Z primary coil $Z_{PC}$ and the second linear X primary coil $X2_{PC}$ and between said linear X primary coil $X2_{PC}$ and the second linear Y primary coil $Y2_{PC}$. The electrical insulation layers also have a thermal insulation effect, the thermal insulation being an undesired side-effect of the electrical insulation layers.

The one Z primary coil is made of hollow conductors and is directly cooled by water or another cooling fluid that flows through said hollow conductors. The one Z primary coil $Z_{PC}$ is sandwiched between the two X primary coils and the two Y primary coils to provide efficient cooling to said two X primary coils and said two Y primary coils. The two X primary coils and two Y primary coils are indirectly cooled by said one Z primary coil. If the Z primary coil were not sandwiched between the two X primary coils and the two Y primary coils, but instead were positioned outside said two X primary coils and said two Y primary coils, the indirect cooling provided by the one Z primary coil for the two X primary coils and the two Y primary coils would not be effective enough because the heat would have to pass four electrical insulation layers which also act as undesired thermal insulation.

Figure 3:
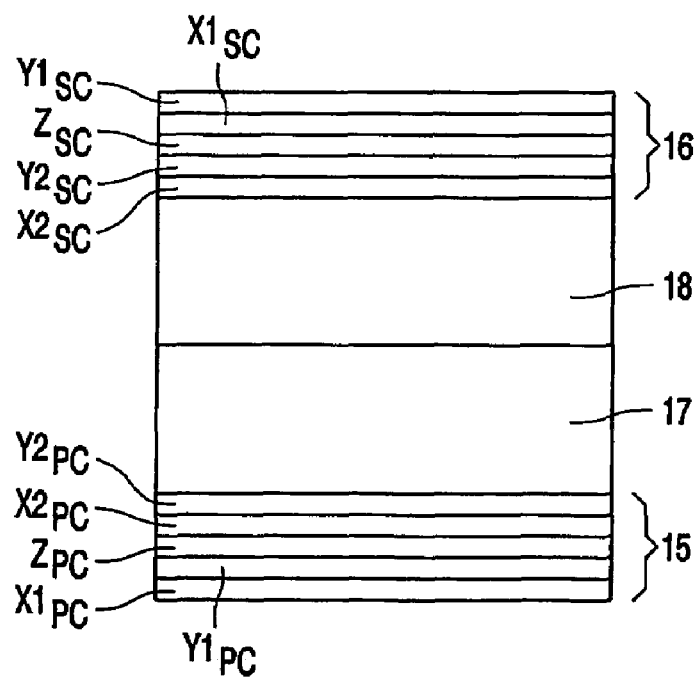
FIG. 3 shows a cross-sectional view through a detail of a gradient coil system according to a second embodiment of the present invention.

FIG. 3 shows a detail of a second embodiment of the present invention. FIG. 3 shows a gradient coil system 14 comprising an inner coil arrangement 15 and an outer coil arrangement 16. The inner coil arrangement 15 of the gradient coil system 14 according to FIG. 3 is designed like the gradient coil system according to FIG. 2 comprising two X primary coils $X1_{PC}$, $X2_{PC}$, two Y primary coils $Y1_{PC}$, $Y2_{PC}$ and one Z primary coil $Z_{PC}$.

In addition to this inner coil arrangement 15 the gradient coil system 14 according to FIG. 3 comprises the outer coil arrangement 16, which outer coil arrangement 16 comprises two X shield coils, two Y shield coils and one Z shield coil. The one Z shield coil is placed or sandwiched between the two X shield coils and the two Y shield coils. On both sides of said Z shield coil $Z_{SC}$ there is arranged one X shield coil and one Y shield coil. The two X shield coils $X1_{SC}$ and $X2_{SC}$ correspond to the two X primary coils $X1_{PC}$ and $X2_{PC}$ in such a way that a first X shield coil $X1_{SC}$ provides good shielding for the first X primary coil $X1_{PC}$ and a second X shield coil $X2_{SC}$ provides good shielding for the second X primary coil $X2_{PC}$. The two Y shield coils $Y1_{SC}$ and $Y2_{SC}$ correspond to the two Y primary coils $Y1_{PC}$ and $Y2_{PC}$ in such a way that a first Y shield coil $Y1_{SC}$ provides good shielding for the first Y primary coil $Y1_{PC}$ and a second Y shield coil $Y2_{SC}$ provides good shielding for the second Y primary coil $Y2_{PC}$.

As shown in FIG. 3, on one side of the Z shield coil $Z_{SC}$ there is positioned the first X shield coil $X1_{SC}$ and the first Y shield coil $Y1_{SC}$. On the other side of the one Z shield coil $Z_{SC}$ there is positioned the second X shield coil $X2_{SC}$ and the second Y shield coil $Y2_{SC}$. The first X shield coil $X1_{SC}$ is positioned between the one Z shield coil $Z_{SC}$ and the first Y shield coil $Y1_{SC}$, and the second Y shield coil $Y2_{SC}$ is positioned between the one Z shield coil $Z_{SC}$ and the second X shield coil $X2_{SC}$. The radius of the X and Y shield coils can either be inside or outside the Z shield coil. This is independent of the radial order of the primary coils.

It should be noted that the shield coils of the outer coil arrangement 16 are glued together like the primary coils of the inner coil arrangement 15. In order to avoid repetitions, it should only be mentioned that for the outer coil arrangement there are also provided electrical insulation layers between each pair of adjacent shield coils, the Z shield coil $Z_{SC}$ which is positioned or sandwiched between the two X shield coils and the two Y shield coils being directly cooled by a cooling fluid, e.g. water, flowing through hollow conductors from which the Z shield coil is made, thereby cooling indirectly the X shield coils and Y shield coils.

It can be taken from FIG. 3 that two layers are positioned between the inner coil arrangement 15 and the outer coil arrangement 16. A first layer 17 is provided in the form of an epoxy layer with filler material. Glass spheres can be used as filler material. The function of the layer 17 is the coupling of forces of the primary coils and shield coils for compensation purposes. A second layer 18 is provided in the form of a so-called GRP tube. The GRP (Glass Reinforced Plastic) tube consists of a carrier tube of wound glass filaments filled with plastic. The GRP tube adds stiffness to the gradient coil system 14. The first layer 17 is positioned adjacent to the inner coil arrangement 15 and the second layer 18 provided in form of the GRP tube is positioned adjacent to the outer coil arrangement 16. It is also possible that the position of the first layer 17 and the second layer 18 are swapped, meaning that the GRP tube is positioned adjacent to the inner coil arrangement 15 and the layer 17 is positioned adjacent to the outer coil arrangement 16.

Figure 4:
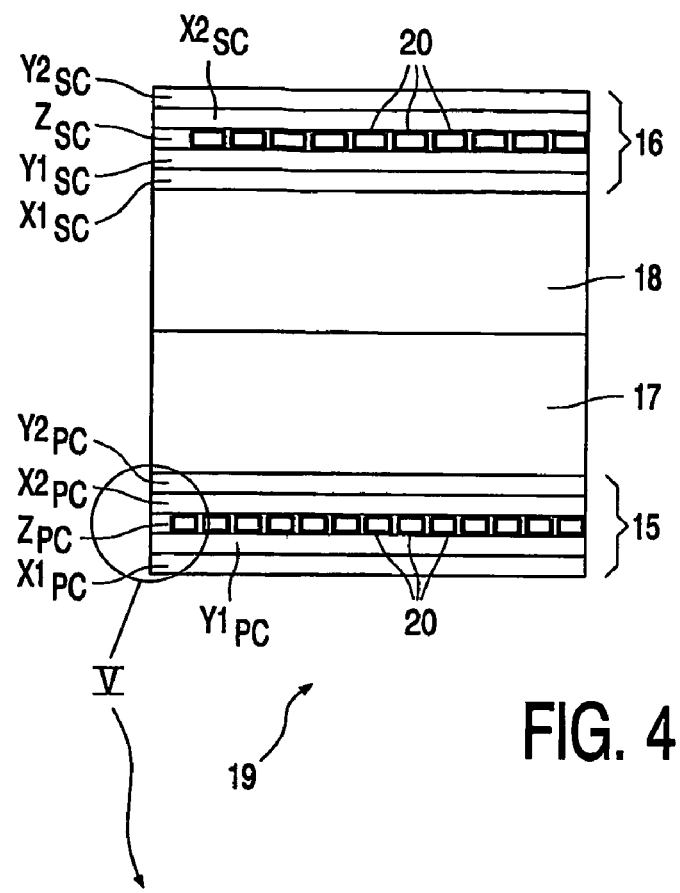
FIG. 4 shows a cross-sectional view through a detail of a gradient coil system according to a third embodiment of the present invention.
Figure 5:
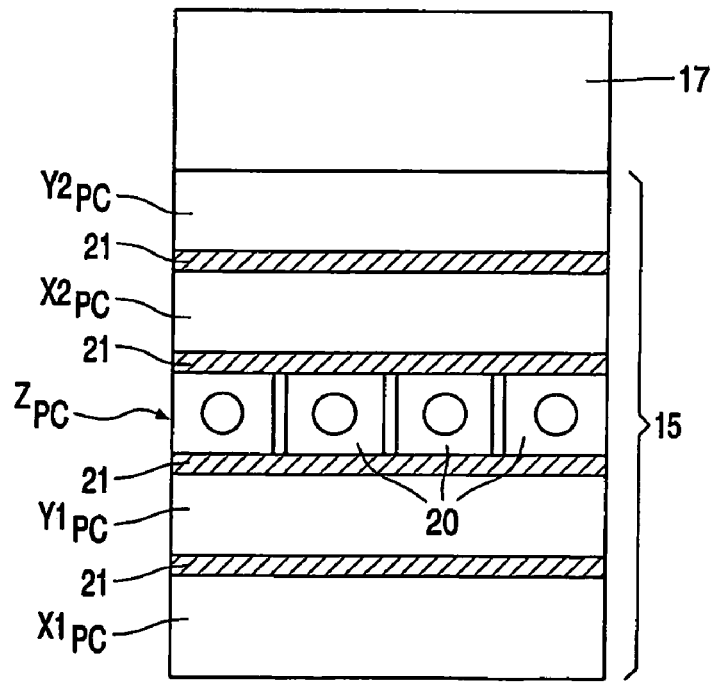
FIG. 5 shows an enlarged detail of the embodiment according to FIG. 4.

FIGS. 4 and 5 show a third embodiment of the present invention. FIG. 5 is an enlarged view of the detail V according to FIG. 4. FIG. 4 shows a gradient coil system 19 which is designed in analogy to the gradient coil system 14 according to FIG. 3. Therefore, in order to avoid repetitions, the same reference numerals are used for the same functional and structural parts.

As shown in FIG. 4, the gradient coil system 19 comprises, like the gradient coil system 14 according to FIG. 3, an inner coil arrangement 15 consisting of five primary coils, an outer coil arrangement 16 consisting of five shield coils and the layers 17 and 18 positioned between the inner coil arrangement 15 and the outer coil arrangement 16. The inner coil arrangement 15 comprising five primary coils, namely the non-linear X primary coil $X1_{PC}$, the non-linear Y primary coil $Y1_{PC}$, the linear X primary coil $X2_{PC}$, the linear Y primary coil $Y2_{PC}$ and the one Z primary coil $Z_{PC}$, corresponds exactly to the inner coil arrangement 15 of the embodiment according to FIG. 3, with FIGS. 4 and 5 explicitly showing the hollow conductors 20 which form the Z primary coil $Z_{PC}$ and the electrical insulation layers 21 positioned between each pair of coils.

The gradient coil system 19 according to FIG. 4 differs from the gradient coil system 14 according to FIG. 3 by the position of the X shield coils and Y shield coils within the outer coil arrangement 16 relative to the one Z shield coil and the layer 18. In the embodiment according to FIG. 4, the first X shield coil $X1_{SC}$ and the first Y shield coil $Y1_{SC}$ are positioned between the one Z shield coil and the layer 18, while in the embodiment according to FIG. 3 the second X and Y shield coils $X2_{SC}$ and $Y2_{SC}$ are positioned between the Z shield coil and the layer 18. Consequently, in the embodiment according to FIG. 4, the first X shield coil $X2_{SC}$ and the first Y shield coil $Y2_{SC}$ are positioned at the outer side of the outer coil arrangement 16.

The present invention provides a gradient coil system for magnetic resonance imaging systems having primary coils or a combination of primary coils and shield coils. The primary coils and/or the shield coils each comprise at least two X coils, at least two Y coils and one Z coil. The Z coil is sandwiched between the at least two X coils and the at least two Y coils. The single Z coil comprises hollow conductors for direct cooling purposes, and water flows through said hollow conductors. The X coils and Y coils are indirectly cooled by said Z coil. Instead of water, a different cooling fluid can be transported through the hollow conductors of the Z coils.

| LIST OF REFERENCE NUMERALS: | |
|---|---|
| 1 | magnetic resonance imaging system |
| 2 | main magnet system |
| 3 | gradient coil system |
| 4 | power supply unit |
| 5 | RF transmitter coil |
| 6 | modulator |
| 7 | object |
| 8 | monitor |
| 9 | transmission/reception circuit |
| 10 | demodulation unit |
| 11 | control unit |
| 12 | processing unit |
| 13 | gradient coil system |
| 14 | gradient coil system |
| 15 | inner coil arrangement |
| 16 | outer coil arrangement |
| 17 | layer |
| 18 | layer |
| 19 | gradient coil system |
| 20 | hollow conductors |
| 21 | electrical insulation layer |

The invention claimed is:

1. A cylindrical MRI gradient coil system, comprising at least two X primary coil elements, at least two Y primary coil elements and one Z primary coil element providing a modular, variable FOV gradient coil system, wherein the one Z primary coil element is made from hollow conductors, and that the one Z primary coil element is directly cooled by a cooling fluid flowing through said hollow conductors, and wherein the at least two X primary coil elements have mutually different linearity volumes by themselves or in combination with each other, the at least two Y primary coil elements have mutually different linearity volumes by themselves or in combination with each other, and the one Z primary coil element is placed between the at least two X primary coil elements and the at least two Y primary coil elements.

2. A gradient coil system according to claim 1, wherein the one Z primary coil element is placed between the at least two X primary coil elements and the at least two Y primary coil elements in such a way that at both sides of the Z primary coil element there is arranged at least one X primary coil element and at least one Y primary coil element such that the cooling fluid flowing through the Z-gradient coil hollow conductors indirectly cools the at least two X and Y primary coil elements.

3. A gradient coil system according to claim 2, wherein the one Z primary coil element is placed between the at least two X primary coil elements and the at least two Y primary coil elements in such a way that at one side of the Z primary coil element there is arranged a first X primary coil element and a first Y primary coil element, and that at the other side of the Z primary coil element there is arranged a second X primary coil-like-element and a second Y primary coil element.

4. A gradient coil system according to claim 1, further including:
at least two X shield coil elements, at least two Y shield coil elements and one Z shield coil element, wherein the one Z shield coil element is placed between the at least two X shield coil elements and the at least two Y shield coil elements.

5. A gradient coil system according to claim 4, wherein the one Z shield coil element is placed between the at least two X shield coil elements and the at least two Y shield coil elements in such a way that at both sides of the Z shield coil element there is arranged at least one X shield coil element and at least one Y shield coil element.

6. A gradient coil system according to claim 1, wherein the at least two X primary coil elements and the at least two Y primary coil elements are positioned on both sides of the one Z primary coil element and are indirectly cooled by said directly cooled Z primary coil element.

7. A gradient coil system according to claim 4, wherein the one Z shield coil element is made from hollow conductors, and the one Z shield coil element is directly cooled by a cooling fluid flowing through said hollow conductors.

8. A gradient coil system according to claim 7, wherein the at least two X shield coil elements and the at least two Y shield coil elements positioned around the one Z shield coil element are indirectly cooled by the directly cooled Z shield coil element.

9. A gradient coil system according to claim 5, wherein the at least two X primary coil elements, the at least two Y primary coil elements and the one Z primary coil element provide an inner coil arrangement, that the at least two X shield coil elements, the at least two Y shield coil elements and the one Z shield coil element provide an outer coil arrangement, and that a layer comprising epoxy with filler material and/or a GRP tube layer are positioned between the inner coil arrangement and the outer coil arrangement.

10. A gradient coil system according to claim 9, wherein the epoxy with filler material and/or a GRP tube layer is positioned adjacent the inner coil arrangement, and the epoxy with filler material and/or a GRP tube layer is also positioned adjacent the outer coil arrangement.

11. A gradient coil system according to claim 9, wherein a one of at least two X primary coil elements and the a one of at least two Y primary coil element are positioned between the one Z primary coil element and the epoxy with filler material and/or a GRP tube layer, and that the one of at least two X shield coil elements and the one of the at least two Y shield coil elements are positioned between the one Z shield coil element and the epoxy with filler material and/or a GRP tube layer.

12. A magnetic resonance imaging system, comprising a main magnet system, a gradient coil system, a RF system and a signal processing system, wherein the gradient coil system is a gradient coil system according to claim 1.

13. A cylindrical MRI gradient coil system surrounding an imaging volume including a primary coil assembly comprising:
a cylindrical Z primary coil element defined of electrically conductive tubular coil elements configured such that current applied to the Z primary coil element causes a gradient magnetic field along a Z direction;
a cooling fluid which flows through the hollow conductors of the Z primary coil element to cool the Z primary coil element directly;
first and second X primary coil elements disposed on radially opposite sides of the Z primary coil element and immediately thermally coupled thereto to be indirectly cooled via the thermal connection by the cooling fluid flowing through the hollow conductors of the Z primary coil element, the first and second X primary coil elements being operative individually or in combination to define mutually different linearity volumes (FOVs); and,
first and second Y primary coil elements disposed on radially opposite sides of the Z primary coil element and immediately thermally coupled thereto to be indirectly cooled by the cooling fluid flowing through the hollow conductors of the Z primary coil element via the thermal connection, the first and second Y primary coil elements being operative individually or in combination to define mutually different linearity volumes (FOVs).

14. The gradient coil system according to claim 13 further including:
a structural support tube surrounding the primary coil assembly; and,
a cylindrical shield coil assembly surrounding and supported by the support tube, the shield coil assembly including:
a Z shield coil element defined of electrically conductive tubular coil elements configured such that current applied to the Z shield coil element causes a gradient magnetic field along a Z direction;
a cooling fluid which flows through the hollow conductors of the Z shield coil element to cool the Z shield coil element directly;
first and second X shield coil elements radially disposed on opposite sides of the Z shield coil element and immediately thermally coupled thereto to be indirectly cooled via the thermal connection by the cooling fluid flowing through the hollow conductors of the Z shield coil element, the first and second X shield coil elements being operative in combination with the first and second X primary coil elements; and,
first and second Y shield coil elements radially disposed on opposite sides of the Y shield coil element and immediately thermally coupled thereto to be indirectly cooled via the thermal connection by the cooling fluid flowing through the hollow conductors of the Z shield coil element, the first and second Y shield coil elements being operative in combination with the first and second Y primary coil elements.

15. A cylindrical MRI gradient coil system surrounding an imaging volume comprising:
- a cylindrical Z primary coil element;
- a first cylindrical X primary coil element and a first cylindrical Y primary coil element concentrically disposed radially inside and abutting the Z primary coil element;
- a second cylindrical X primary coil element and a second cylindrical Y primary coil element concentrically disposed radially outward from and contiguous to the Z primary coil element;
- a cylindrical Z shield coil element disposed radially outward and displaced from the second cylindrical X primary coil element and the second cylindrical Y primary coil element;
- a first cylindrical X shield coil element and a first cylindrical Y shield coil element concentrically disposed radially inside and contiguous to the Z shield coil element and displaced from the second cylindrical X primary coil element and the second cylindrical Y primary coil element;
- a second cylindrical X shield coil element and a second Y cylindrical shield coil element disposed concentrically outside the Z shield coil element.

16. The gradient coil system according to claim 15, wherein the Z primary coil element includes an electrically conductive tubular coil element through which a cooling fluid flows, the first and second cylindrical X and Y coil element being immediately thermally connected to the Z primary coil element such that the cooling fluid directly cools the Z primary coil element and indirectly cools via the thermal connection the first and second X and Y primary coil elements; and the Z shield coil element includes an electrically conductive tubular coil element through which a cooling fluid flows, the first and second cylindrical X and Y coil element being immediately thermally connected to the Z shield coil element such that the cooling fluid directly cools the Z shield coil element and indirectly cools, via the thermal connection, the first and second X and Y shield coil elements.

17. The gradient coil system according to claim 15, wherein the first and second X primary coil elements have mutually different linearity volumes (FOVs) by themselves or in combination with each other, and the first and second Y primary coil elements have mutually different linearity volumes (FOVs) by themselves or in combination with each other.

18. The gradient coil system according to claim 17, wherein the first and second X primary coil elements have different linearity volumes (FOVs) such that when the first and second X gradient coil assembly are used in combination with a gradient current of one polarity in the second X gradient coil, a first volume (Vx1) is defined and such that when the first and second X primary coil elements are used in combination with a current of a second polarity opposite to the first polarity flowing through the second X primary coil element, a second volume (Vx2) is defined.

19. The gradient coil system according to claim 18, wherein the first and second Y primary coil elements have different linearity volumes (FOVs) such that when the first and second Y gradient coil assembly are used in combination with a gradient current of one polarity in the second Y gradient coil, a first volume (Vy1) is defined and such that when the first and second Y primary coil elements are used in combination with a current of a second polarity opposite to the first polarity flowing through the second Y primary coil element, a second volume (Vy2) is defined.

* * * * *